US009230782B2

(12) United States Patent
Ikegami et al.

(10) Patent No.: US 9,230,782 B2
(45) Date of Patent: *Jan. 5, 2016

(54) PLASMA PROCESSING METHOD AND APPARATUS

(71) Applicant: Hitachi High-Technologies Corporation, Tokyo (JP)

(72) Inventors: Eiji Ikegami, Kudamatsu (JP); Shoji Ikuhara, Hikari (JP); Takeshi Shimada, Hikari (JP); Kenichi Kuwabara, Hikari (JP); Takao Arase, Kudamatsu (JP); Tsuyoshi Matsumoto, Kudamatsu (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/508,859

(22) Filed: Oct. 7, 2014

(65) Prior Publication Data

US 2015/0020970 A1 Jan. 22, 2015

Related U.S. Application Data

(60) Continuation of application No. 12/846,403, filed on Jul. 29, 2010, now Pat. No. 8,900,401, which is a division of application No. 11/502,416, filed on Aug. 11, 2006, now Pat. No. 8,038,896.

(30) Foreign Application Priority Data

May 31, 2006 (JP) ................................. 2006-152305

(51) Int. Cl.
*H01L 21/306* (2006.01)
*C23C 16/00* (2006.01)
(Continued)

(52) U.S. Cl.
CPC ......... *H01J 37/32963* (2013.01); *H01J 37/321* (2013.01); *H01J 37/32082* (2013.01);
(Continued)

(58) Field of Classification Search
CPC ............... H01J 37/321; H01J 37/3211; H01J 37/32917; H01J 37/32926; H01J 37/32935; H01J 37/32944; H01J 37/32954; H01J 37/32963; H01J 37/32972; H01J 37/32981; H01J 37/3299; H01J 37/32082; H01J 37/32091; H01J 37/32192
USPC ....... 118/723 I, 723 IR, 723 AN; 156/345.48, 156/345.49; 315/111.51
See application file for complete search history.

(56) References Cited

U.S. PATENT DOCUMENTS 6,624,064 B1 9/2003 Sahin et al.
7,067,432 B2 6/2006 Xu et al.
(Continued)

FOREIGN PATENT DOCUMENTS

JP 06-120173 4/1994
JP 07-263408 10/1995
(Continued)

OTHER PUBLICATIONS

Japanese Official Action issued Oct. 11, 2011, for JP Application No. 2006-152305.

*Primary Examiner* — Luz Alejandro Mulero
(74) *Attorney, Agent, or Firm* — Baker Botts L.L.P.

(57) ABSTRACT

Plasma processing of plural substrates is performed in a plasma processing apparatus, which is provided with a plasma processing chamber having an antenna electrode and a lower electrode for placing and retaining the plural substrates in turn within the plasma processing chamber, a gas feeder for feeding processing gas into the processing chamber, a vacuum pump for discharging gas from the processing chamber via a vacuum valve, and a solenoid coil for forming a magnetic field within the processing chamber. At least one of the plural substrates is placed on the lower electrode, and the processing gas is fed into the processing chamber. RF power is fed to the antenna electrode via a matching network to produce a plasma within the processing chamber in which a magnetic field has been formed by the solenoid coil. This placing of at least one substrate and this feeding of the processing gas are then repeated until the plasma processing of all of the plural substrates is completed. An end of seasoning is determined when a parameter including an internal pressure of the processing chamber has become stable to a steady value with plasma processing time.

2 Claims, 12 Drawing Sheets

(51) Int. Cl.
*H01J 37/32* (2006.01)
*H05H 1/46* (2006.01)
*H01L 21/67* (2006.01)

(52) U.S. Cl.
CPC ....... *H01J37/32091* (2013.01); *H01J 37/3299* (2013.01); *H01J 37/32192* (2013.01); *H01J 37/32917* (2013.01); *H01J 37/32926* (2013.01); *H01J 37/32935* (2013.01); *H01J 37/32981* (2013.01); *H01L 21/67242* (2013.01); *H05H 1/46* (2013.01); *H01J 37/3211* (2013.01); *H01J 2237/1825* (2013.01); *H01J 2237/327* (2013.01); *H01L 21/67069* (2013.01)

(56) References Cited

U.S. PATENT DOCUMENTS

| | | | |
|---|---|---|---|
| 7,194,821 | B2 | 3/2007 | Edamura et al. |
| 8,900,401 | B2 * | 12/2014 | Ikegami et al. .......... 156/345.24 |
| 2003/0211735 | A1 | 11/2003 | Rossman |
| 2004/0009617 | A1 | 1/2004 | Masuda et al. |
| 2005/0045107 | A1 | 3/2005 | Koroyasu et al. |
| 2005/0118835 | A1 | 6/2005 | Kurt |
| 2005/0126709 | A1 | 6/2005 | Takayama et al. |
| 2005/0154482 | A1 | 7/2005 | Tomoyasu |
| 2005/0284574 | A1 | 12/2005 | Tanaka et al. |
| 2007/0051470 | A1 | 3/2007 | Iwakoshi et al. |

FOREIGN PATENT DOCUMENTS

| | | |
|---|---|---|
| JP | 09-082645 | 3/1997 |
| JP | 11-135482 | 5/1999 |
| JP | 11-233487 | 8/1999 |
| JP | 2001-081545 | 3/2001 |
| JP | 2001-152341 | 6/2001 |
| JP | 2002-057149 | 2/2002 |
| JP | 2002-124503 | 4/2002 |
| JP | 2003-532986 | 11/2003 |
| JP | 2004-235349 | 8/2004 |
| JP | 2005-217448 | 8/2005 |
| JP | 2005-228727 | 8/2005 |
| JP | 2006-019501 | 1/2006 |
| JP | 2006-041470 | 2/2006 |
| JP | 2006-073751 | 3/2006 |
| WO | WO 01/84591 | 11/2001 |

* cited by examiner

PLASMA PROCESSING METHOD AND APPARATUS

This application is a continuation application of application Ser. No. 12/846,403, filed Jul. 29, 2010, which is a Divisional application of prior application Ser. No. 11/502,416, filed Aug. 11, 2006, now U.S. Pat. No. 8,038,896, issued on Oct. 18, 2011, the contents of which are incorporated herein by reference in their entirety.

FIELD OF THE INVENTION

This invention relates to a plasma processing technology, and especially to a plasma processing technology that makes it possible to determine the end of seasoning with high accuracy.

DESCRIPTION OF THE BACKGROUND

A plasma processing apparatus has a processing chamber to contain one or more substrates such as semiconductor substrates, and during plasma processing of the substrate or substrates, nonvolatile reaction products occur and deposit on an inner wall and the like of the processing chamber. In the subsequent processing, the deposit may separate from the inner wall and the like of the processing chamber and may fall and deposit as dust particles on substrate surface or surfaces under processing. It is to be noted that in the background art to be described hereinafter, the processing chamber will be assumed to contain a plurality of substrates at the same time.

The deposited dust particles cause short-circuiting, breakage and/or incomplete etching of interconnecting electrical conductors of integrated circuits arranged on the substrate surfaces, and hence, become a cause of unacceptable semiconductor devices. Such dust particles, therefore, lead to a reduction in yield in the fabrication of semiconductor devices. To avoid this problem, the processing chamber is opened to the atmosphere, and components in the processing chamber are replaced by swap components which have been cleaned up beforehand, or as an alternative, the processing chamber is subjected to so-called wet cleaning that the inside of the processing chamber is wiped off with pure water or alcohol to clean it up.

The conditions of the inner wall of the processing chamber shortly after the wet cleaning are different from the corresponding conditions during steady mass fabrication. Accordingly, the processing performance of the plasma etching apparatus shortly after the wet cleaning, such as etch rate, etch rate distribution in each substrate surface, etch selectivity (etch rate ratio) between a material under etching on each substrate and its corresponding mask or underlying layer, etched profiles, is different from that of the same plasma etching apparatus during steady mass fabrication.

For the prevention of occurrence of such a problem, it is a common practice to perform processing called "seasoning discharge" (which may hereinafter be called simply "seasoning") such that the conditions in the processing chamber, which have been changed by wet cleaning, are brought back close to those during steady mass fabrication. This seasoning is often performed by simulating processing of semiconductor substrates. The processing time for the seasoning is needed to be as much as that required for the processing of one to several lots (25 substrates per lot) depending upon the extent of the wet cleaning, and may widely scatter in many instances.

When the processing time required for seasoning becomes as long as the order of lots as mentioned above, a substantial number of substrates (dummy wafers) are processed during the seasoning. The processing of such many dummy wafers leads to an increase in the non-operation time of the apparatus, and hence, to a rise in the fabrication cost of semiconductor devices.

As a technology for resolving such a problem, JP-A-2004-235349 is known. This document discloses to determine the conditions in a processing chamber by calculating differences between scores of a principal component, which have been obtained by subjecting the plasma emission data of a lot (hereinafter called "the current lot") to a principal component analysis, and scores of the same principal component in the preceding lot, determining an average of the differences in the current lot, the maximum and minimum values among the scores of the principal component in the current lot, and a standard deviation of the scores of the principal component in the current lot, and then comparing these values with preset standard deviations, respectively.

According to the above-described method of the conventional technology, however, data conditions for use in the determination of the end of seasoning have to be set newly depending upon the processing conditions for substrates, thereby making it difficult to apply the above-described method. Moreover, it may be difficult to determine the end depending upon the extent of the wet cleaning or the conditions of seasoning.

SUMMARY OF THE INVENTION

With the foregoing problems in view, the present invention has as a principal object the provision of a plasma processing technology which makes it possible to determine the end of seasoning with high accuracy by a versatile method.

To resolve the above-described problems, the present invention provides, in one aspect thereof, a plasma processing method for performing plasma processing of plural substrates in a plasma processing apparatus, which is provided with:

a plasma processing chamber having an antenna electrode and a lower electrode for placing and retaining the plural substrates in turn within the plasma processing chamber, a gas feeder for feeding processing gas into the processing chamber, a vacuum pump for discharging gas from the processing chamber via a vacuum valve, and a solenoid coil for forming a magnetic field within the processing chamber, by placing at least one of the plural substrates on the lower electrode, feeding the processing gas into the processing chamber, feeding RF power to the antenna electrode via a matching network to produce a plasma within the processing chamber, in which a magnetic field has been formed by the solenoid coil, and repeating the placing and the feeding of the processing gas until the plasma processing of all of the plural substrates is completed, wherein an end of seasoning is determined when a parameter comprising an internal pressure of the processing chamber has become stable to a steady value with plasma processing time.

In another aspect of the present invention, there is also provided a plasma processing apparatus provided with:

a plasma processing chamber having an antenna electrode and a lower electrode for placing and retaining the plural substrates in turn within the plasma processing chamber, a gas feeder for feeding processing gas into the processing chamber, a vacuum pump for discharging gas from the processing chamber via a vacuum valve, and a solenoid coil for forming a magnetic field within the processing chamber, for conducting plasma processing of the plural substrates by reassembling the processing chamber, placing at least one of the plural substrates on the lower electrode, feeding the processing gas into the processing chamber, feeding RF power to the antenna electrode via a matching network to produce a plasma within the processing chamber, in which a magnetic field has been formed by the solenoid coil, and repeating the placing and the feeding of the processing gas until said plasma processing of all of said plural substrates is completed, wherein said plasma processing apparatus further comprises a sensor for monitoring, with time, changes in an internal pressure of the plasma processing chamber in a state of plasma production and a computing unit for determining an end of seasoning in the plasma processing apparatus on a basis of the changes with time, and the computing unit determines the end of the seasoning discharge when the internal pressure of the processing chamber has fallen to a steady value with plasma processing time.

Owing to the inclusion of the above-described features, the plasma processing method and apparatus according to the present invention can determine, after wet cleaning, the end of seasoning with high accuracy by a versatile method.

DETAILED DESCRIPTION OF PREFERRED EMBODIMENTS

Figure 1:
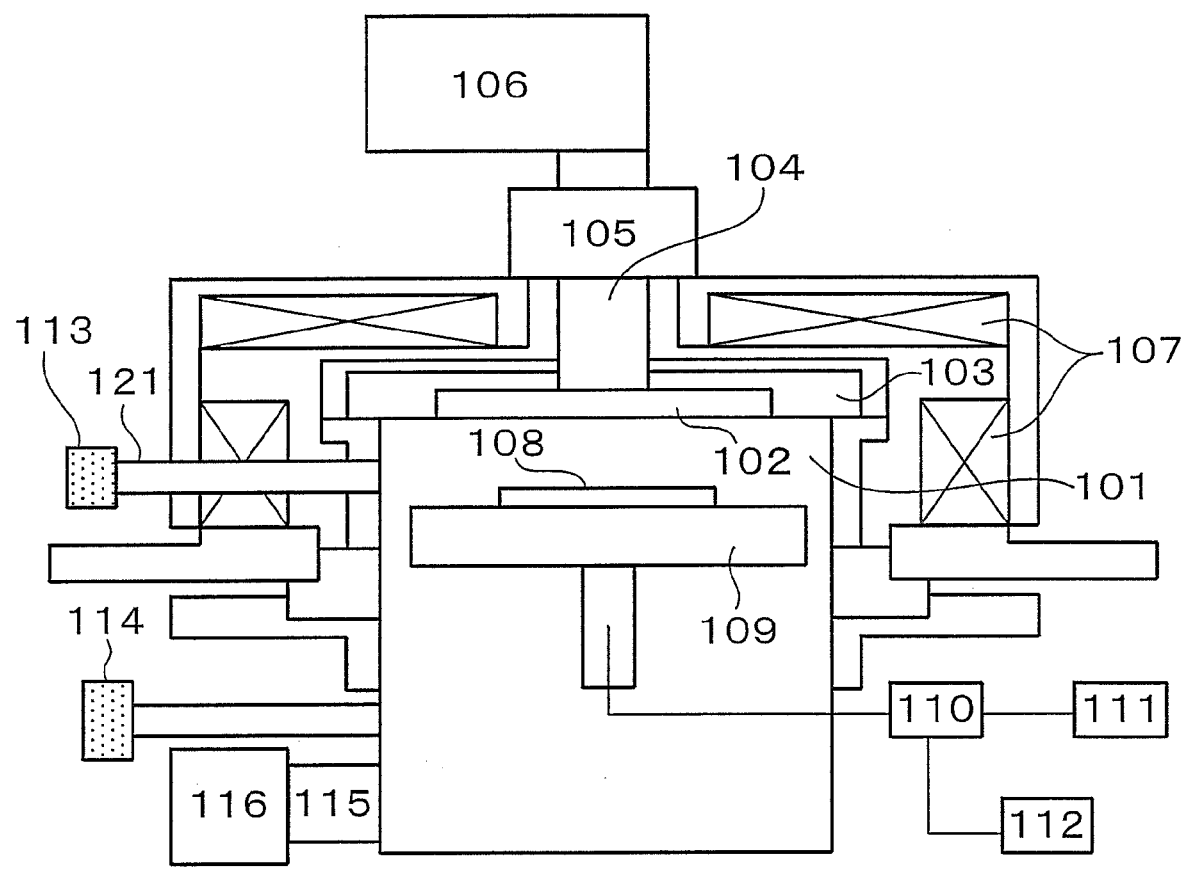
FIG. 1 is a simplified diagram of a plasma etching apparatus making use of UHF-ECR (Electron Cyclotron Resonance), to which the present invention can be applied.

Certain preferred embodiments of the present invention will hereinafter be described with reference to the accompanying drawings. Referring first to FIG. 1, a plasma etching apparatus making use of UHF-ECR, to which the present invention is applicable, radiates UHF electromagnetic waves from an antenna 102 to produce a plasma by an interaction with a magnetic field.

In a plasma processing chamber in the plasma etching apparatus (in this case, an etching chamber 101), its inner wall can be controlled within a temperature range of from 20 to 100° C. by a temperature control means (not shown). On a top part of the etching chamber 101, the antenna 102 is arranged, and between the etching chamber 101 and the antenna 102, there is disposed a dielectric 103 through which UHF electromagnetic waves can transmit. Connected to the antenna 102 via a waveguide 104 and a matching network 105 is a RF power source 106 which produces UHF electromagnetic waves.

On and around an outer peripheral part of the etching chamber 101, a solenoid coil 107 is arranged to form a magnetic field in the etching chamber 101. Inside the etching chamber 101 and below the antenna 102, a lower electrode 109 is disposed as a pedestal for placing a substrate such as a wafer 108 thereon. To the lower electrode 109, a RF power source 111 located outside the etching chamber 101 is connected via a RF bias matching network 110.

In the plasma etching apparatus constructed as described above, UHF electromagnetic waves outputted from the RF power source 106 are fed into the etching chamber 101 via the matching network 105, waveguide 104 and antenna 102.

On the other hand, a magnetic field is formed in the etching chamber 101 by the solenoid coil 107 arranged around the etching chamber 101. By an interaction between the UHF electromagnetic waves and the magnetic field formed by the solenoid coil 107, etching gas introduced into the etching chamber 101 via a gas feeder (not shown) is efficiently converted into a plasma.

Figure 2:
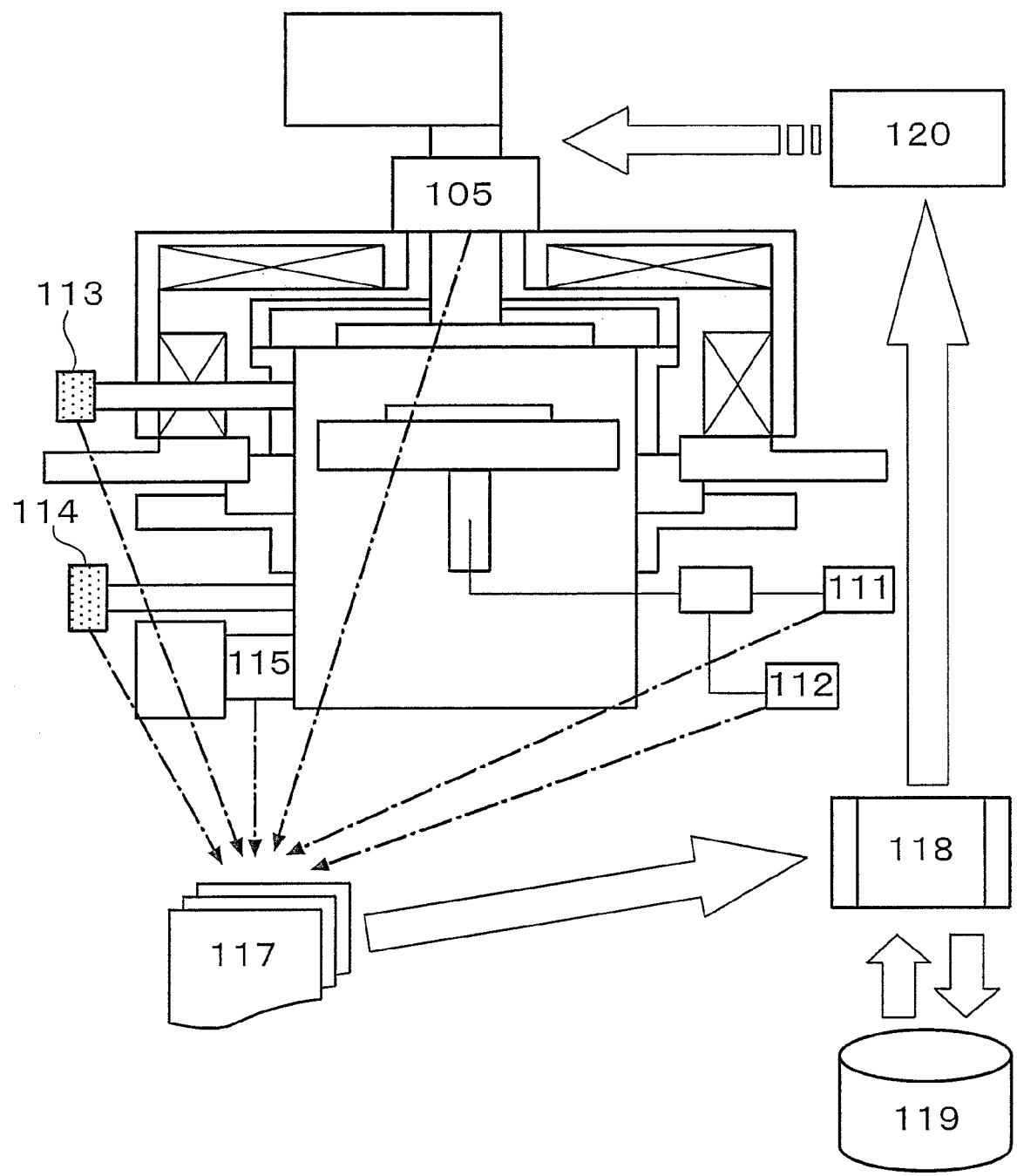
FIG. 2 is a simplified diagram of a constitution for determining the end of seasoning.

Referring next to FIG. 2, designated at numeral 117 is a data collection unit, which during plasma etching, successively monitors one or more etching parameters and collects the monitored data. As such etching parameter or parameters to be collected, (1) plasma emission intensity (spectrum intensity), (2) wafer bias voltage, (3) the opening of the vacuum valve, (4) the vacuuming time of the etching chamber, (5) the matching capacitance of one of the capacitors as components in the matching network, (6) plasma ignition time, (7) electrostatic chuck voltage, and/or (8) the flow rate of heat transfer gas can be exemplified.

Numeral 119 indicates a database unit which stores criterion values for determining the end of seasoning. Numeral 118 designates a computing unit, which compares the data collected by the collection unit 117 with the corresponding criterion value or values stored in the database unit 119 and then performs computation. As a result, it is possible to determine the end of seasoning conducted subsequent to wet cleaning. Indicated at numeral 120 is a control unit, which controls the etching apparatus on the basis of output signals from the computing unit 118.

A detailed description will hereinafter be made of examples that determine the end of seasoning.

Example 1

In this example, the intensity of plasma emission is chosen as a parameter to be monitored. Specifically, a plasma emission produced in the etching chamber 101 is guided out through an optical fiber 121, and the guided-out emission is monitored by a photodetector 113.

Figure 3:
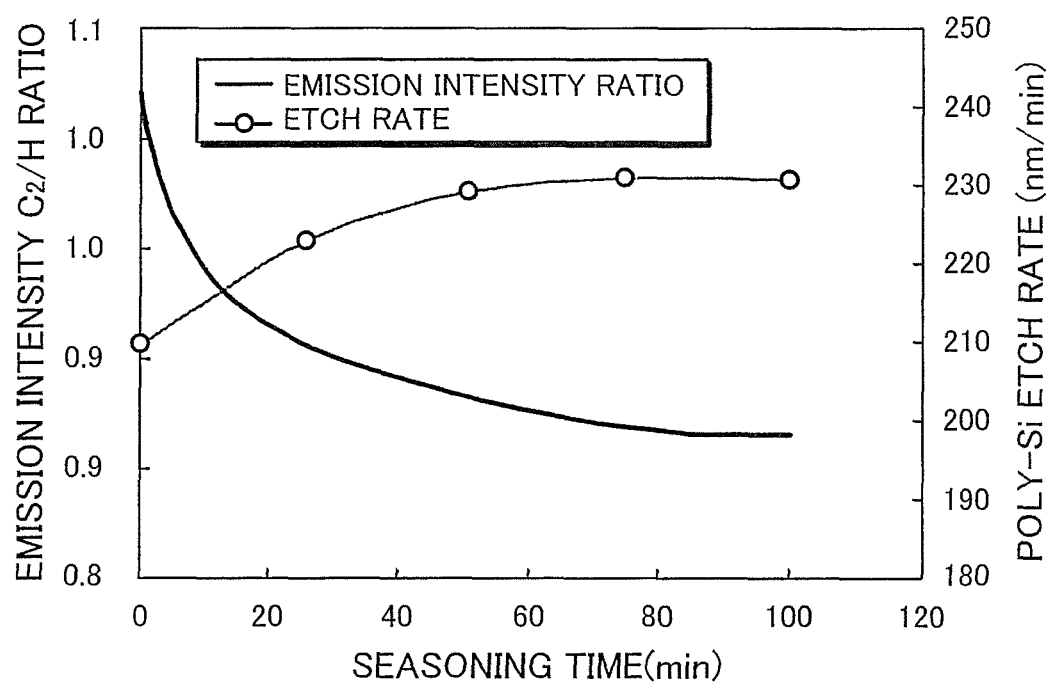
FIG. 3 is a graphic representation of the transition of changes in etch rate and that of changes in emission intensity ratio ($C_2$/H) versus the cumulative time of seasoning in Example 1.

FIG. 3 illustrates the transition of changes in etch rate versus the cumulative time of seasoning when the seasoning was performed using a mixed gas composed primarily of fluorine (F) subsequent to wet cleaning. It is to be noted that in the seasoning, plasma processing for dummy wafers was successively performed while replacing the dummy wafers one by one. It is also to be noted that by way of example, the monitoring was performed in a final stage of plasma processing for each wafer.

A fluorine (F)-containing processing gas employed in this example was a mixed gas of $SF_6$ and $CHF_3$, the flow rates of which were 15 mL/min and 112 mL/min, respectively. On the other hand, the processing pressure was 0.4 Pa, the plasma-producing electric power was 800 W, and the RF bias applied to the lower electrode 109 was 15 W.

In FIG. 3, the curve a shows the transition of changes in the etch rate of polysilicon formed on the wafer (dummy wafer) 108 as a substrate. The curve b, on the other hand, shows the transition of changes in the emission intensity ratio ($C_2$/H) between carbon ($C_2$) and hydrogen (H) during the seasoning.

As shown in FIG. 3, it is appreciated that the etch rate of polysilicon becomes more stable as the seasoning time becomes longer. This tendency may presumably take place as will be described hereinafter. Described specifically, some of carbon-containing reaction products, which occur in seasoning and include deposits, C, CF, CH and the like, deposit on the inner wall of a plasma processing chamber, and the rest of them is vented.

If the seasoning is insufficient, in other words, shortly after wet cleaning, there is a high probability that carbon-containing deposits still remain on the inner wall of the processing chamber. The fluorine (F) in the thus-fed mixed gas is, therefore, consumed by the carbon-containing deposits still remaining on the inner wall of the processing chamber. It is, accordingly, considered that the feed rate of fluorine (F) to the wafer decreases to lead to a reduction in the etch rate of polysilicon.

When the seasoning is performed thoroughly, on the other hand, the carbon-containing deposits on the inner wall of the processing chamber are rendered less. It is, hence, considered that the fluorine (F) to be consumed at the inner wall of the processing chamber decreases, the feed rate of fluorine (F) to the wafer increases, and the etch rate of polysilicon increases.

When the transition of changes in the emission intensity ratio ($C_2$/H) of a plasma emission has been monitored and the emission intensity ratio ($C_2$/H) has reached a steady value as illustrated by the curve b in FIG. 3, the end of seasoning can be determined accordingly.

Example 2

In this example, a wafer bias voltage $V_{pp}$ (peak-to-peak voltage) is chosen as a parameter to be monitored.

Three etching apparatus (apparatus 1, apparatus 2, apparatus 3) of the same specification were used. After applying wet cleaning to each etching apparatus, vacuuming was initiated. The vacuuming was continued until the pressure in its processing chamber reached 0.0005 Pa or lower. It was also confirmed that the out-gas rate in the processing chamber was 0.08 Pa·L/sec or lower. Subsequently, while repeatedly performing seasoning by using fresh Si wafers (dummy wafers), the $V_{pp}$ voltage of the RF bias power source 111 was measured. The $V_{pp}$ was detected at the RF bias matching network 110.

A plasma was produced, for example, by controlling the plasma-producing power at 600 W and using a mixed gas of $Cl_2$/HBr/$O_2$ as a processing gas, and under the condition that a RF bias was applied at 50 W, processing was performed.

By setting the processing pressure of the three etching apparatus at 1.6 Pa, 1.2 Pa and 0.4 Pa, separately, processing was performed. Changes in $V_{pp}$ were monitored at each of the processing pressures. The pressure of the processing chamber 101 in each etching apparatus was monitored via a pressure gauge 114 as a sensor.

Figure 4:
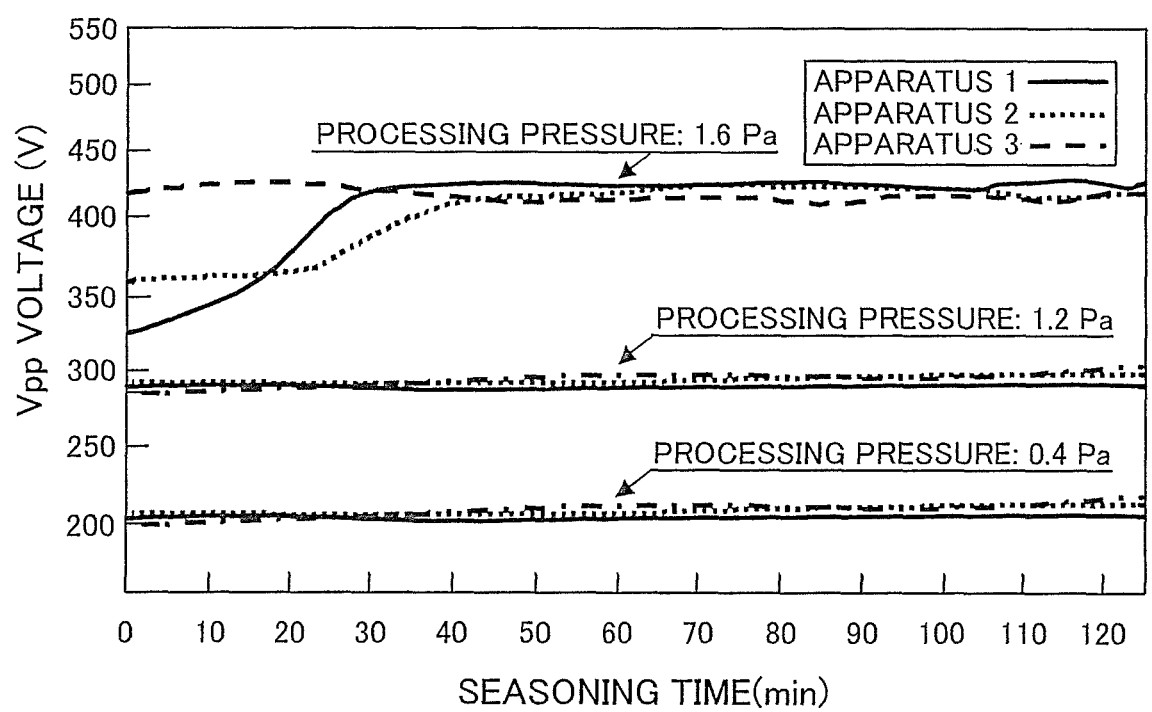
FIG. 4 is a graphic representation of the transition of changes in the peak-to-peak voltage of a wafer bias voltage at varied processing pressures versus the cumulative time of seasoning in Example 2.

As readily envisaged from the processing at the processing pressure of 1.6 Pa in FIG. 4, the three processing apparatus showed different values as $V_{pp}$ voltage shortly after the wet cleaning. It is, however, appreciated that, as seasoning is continued, the $V_{pp}$ voltage becomes stable at a constant voltage. This tendency may presumably take place as will be described hereinafter. Described specifically, reaction products between Si and an etching gas deposit on the inner wall of a processing chamber when the seasoning is insufficient. It is, however, considered that, when the seasoning becomes sufficient, the reaction products deposited on the inner wall of the processing chamber or water or the like remained in the processing chamber upon wet cleaning are or is eliminated to stabilize the conditions of the apparatus.

When the peak-peak-voltage $V_{pp}$ of a RF bias to be fed to a lower electrode has increased to a steady value with the processing time for seasoning, the end of seasoning can be determined accordingly.

As readily envisaged from the processing at the processing pressure of 1.2 Pa or the processing at the processing pressure of 0.4 Pa illustrated in FIG. 4, the $V_{pp}$ voltage is hardly affected by the out-gas or the like from the inner wall of a processing chamber to make it difficult to effectively detect $V_{pp}$ changes in the case of processing conditions that the processing pressure is lower than 1.6 Pa.

Example 3

In this example, the opening of a vacuum valve 115 (VV opening) is chosen as a parameter to be monitored. The vacuum valve 115 controls the degree of vacuuming by a turbomolecular pump 116 such that the pressure in the processing chamber is reduced to a preset pressure.

After applying wet cleaning to each of the three etching apparatus (apparatus 1, apparatus 2, apparatus 3) of the same specification, vacuuming was initiated, for example, at a constant flow rate by the turbomolecular pump 116, and the vacuuming was continued until the pressure in its processing chamber reached 0.0005 Pa or lower. A plasma was then produced, for example, by controlling the internal pressure of the processing chamber at 2.0 Pa, setting the plasma-producing power at 600 W and using a mixed gas of $Cl_2$/HBr/$O_2$ as a processing gas, and under the condition that a RF bias was applied at 50 W, processing was performed. Using Si wafers (dummy wafers) as substrates, the vacuum valve opening required to maintain the internal pressure of the processing chamber at 2.0 Pa in each seasoning was measured.

Figure 5:
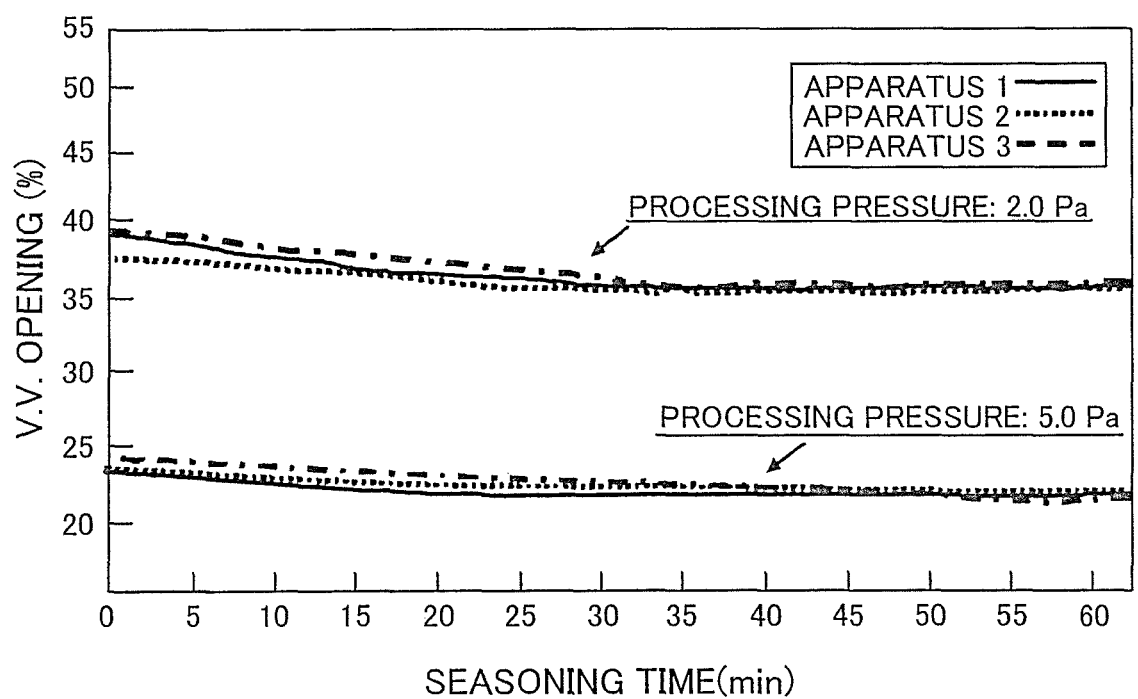
FIG. 5 is a graphic representation of the transition of changes in the opening of a vacuum valve at varied processing pressures versus the cumulative time of seasoning in Example 3.

As readily envisaged from the processing at the processing pressure of 2.0 Pa in FIG. 5, it is appreciated that the opening of a vacuum valve is large shortly after wet cleaning.

As a reason for the above-described tendency, insufficient seasoning results in the production of out-gas from water still remaining in the processing chamber as a result of wet cleaning or deposits formed through reactions with atmospheric components, and the thus-produced out-gas slightly raises the internal pressure of the processing chamber. When the seasoning becomes sufficient, the remaining water or deposits are removed so that the resulting out-gas decreases. The rise in the internal pressure of the processing chamber is, therefore, inhibited to result in a smaller vacuum valve opening. As indicated by the processing at the processing pressure of 5.0 Pa in FIG. 5, the control of the internal pressure of the processing chamber at 5.0 Pa also brings about a similar tendency as the control of the internal pressure of the processing chamber at 2.0 Pa.

When the opening of a vacuum valve has decreased to a steady value with the processing time for seasoning, the end of seasoning can be determined accordingly.

Example 4

In this example, the time required until the internal pressure of the processing chamber reached a constant pressure when the residual gas in the processing chamber was discharged by the turbomolecular pump subsequent to seasoning making use of Si wafers (dummy wafers) was chosen as a parameter to be monitored, and the transition of changes in this time was monitored.

After applying wet cleaning to two etching apparatus (apparatus 1, apparatus 2) of the same specification, vacuuming was initiated to reduce the internal pressure of each processing chamber to 0.0005 Pa or lower. After the out-gas rate in the processing chamber at that time was confirmed to be 0.08 Pa·L/sec or lower, seasoning was performed using fresh Si wafers (dummy wafers).

A plasma was then produced, for example, by controlling the processing pressure at 0.4 Pa, setting the plasma-producing power at 600 W and using a mixed gas of $Cl_2/HBr/O_2$ as a processing gas, and under the condition that a RF bias was applied at 50 W, processing was performed.

After the seasoning making use of the Si wafers (dummy wafers) was performed, the residual gas in the processing chamber was discharged, for example, at a constant flow rate by the turbomolecular pump 116. The time required to reach a constant pressure (target pressure) at that time was measured.

In this example, the ultimate pressure was set at 0.005 Pa, and the time until that pressure was reached was measured. The internal pressure of the processing chamber was monitored by the pressure gauge 114.

Figure 6:
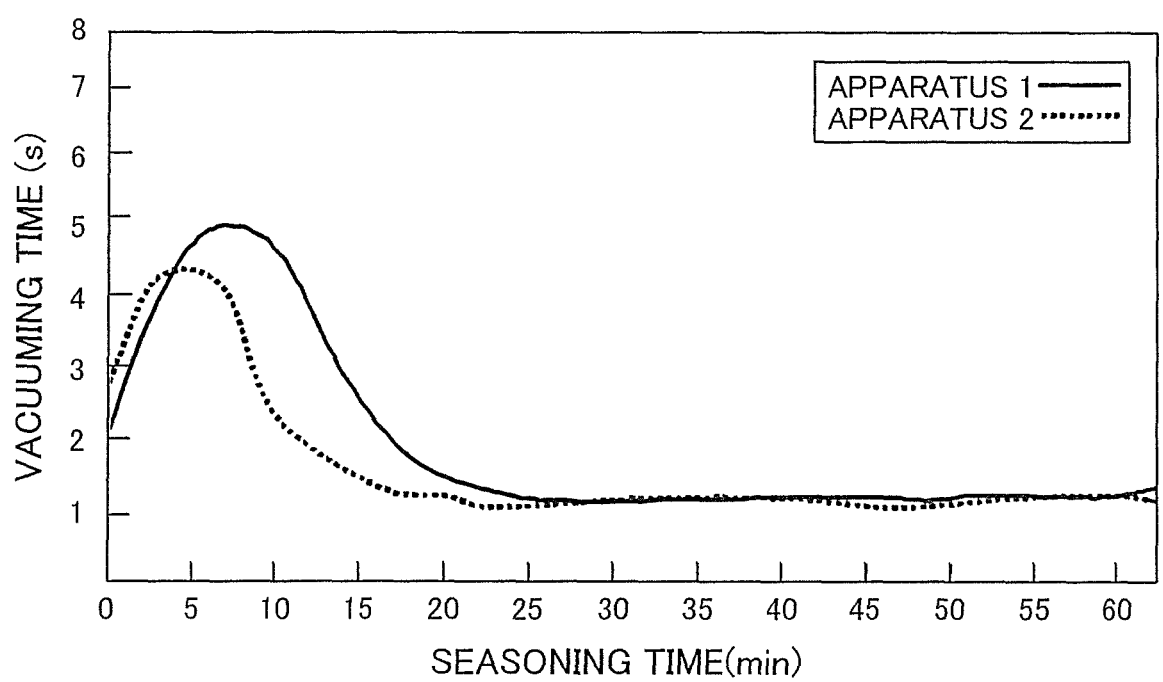
FIG. 6 is a graphic representation of the transition of changes in vacuuming time in different plasma processing apparatus versus the cumulative time of seasoning in Example 4.

FIG. 6 shows the transition of changes in the time (vacuuming time) until the above-described target pressure (0.005 Pa) was reached. As illustrated in FIG. 6, it is appreciated that shortly after wet cleaning, the time required to reach a target pressure is long. As a reason for this tendency, it is presumed that substances produced through reactions with water remaining in the processing chamber or atmospheric components by the wet cleaning are dissociated by a plasma discharge and affect the vacuuming time after the plasma discharge.

When seasoning making use of Si wafers (dummy wafers) is repeated, the above-described vacuuming time is progressively shortened to become steady in a constant time. This indicates that the conditions within the processing chamber have become steady. When the transition of changes in vacuuming time subsequent to seasoning has been monitored and the time required until the internal pressure of the processing chamber is reduced to a target pressure has decreased to a steady value with the seasoning time, the end of the seasoning can be determined.

Example 5

In this example, the matching electrostatic capacitance of each capacitor as a component in the matching network 105 (source RF bias matching network) was chosen as a parameter to be monitored, and the transition of changes in the capacitance was monitored.

Figure 7:
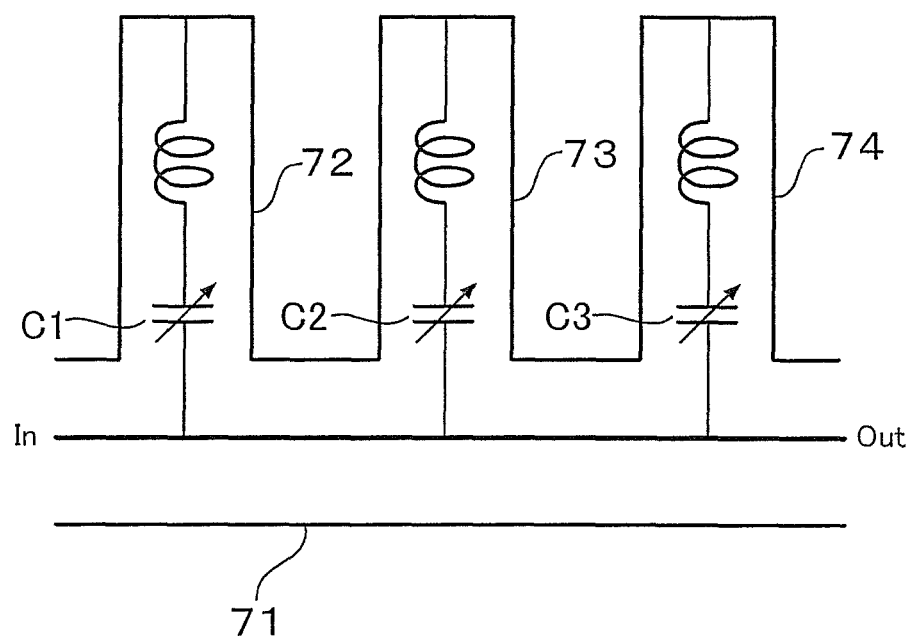
FIG. 7 is a simplified diagram of a matching network connected to a plasma-producing RF source, and in Example 5, the transition of changes in the matching capacitance of each capacitor in the matching network was monitored.

FIG. 7 illustrates the construction of the matching network 105. In FIG. 7, numeral 71 indicates a coaxial line which connects the plasma-producing RF power source 106 and the waveguide 104 with each other. Designated at numerals 72, 73, 74 are branch lines all connected to the coaxial line 71. A resonance circuit formed of a capacitor C1 and reactor L1 is inserted in the branch line 72, a resonance circuit formed of a capacitor C2 and reactor L2 is inserted in the branch line 73, and a resonance circuit formed of a capacitor C3 and reactor L3 is inserted in the branch line 74.

Figure 8A:
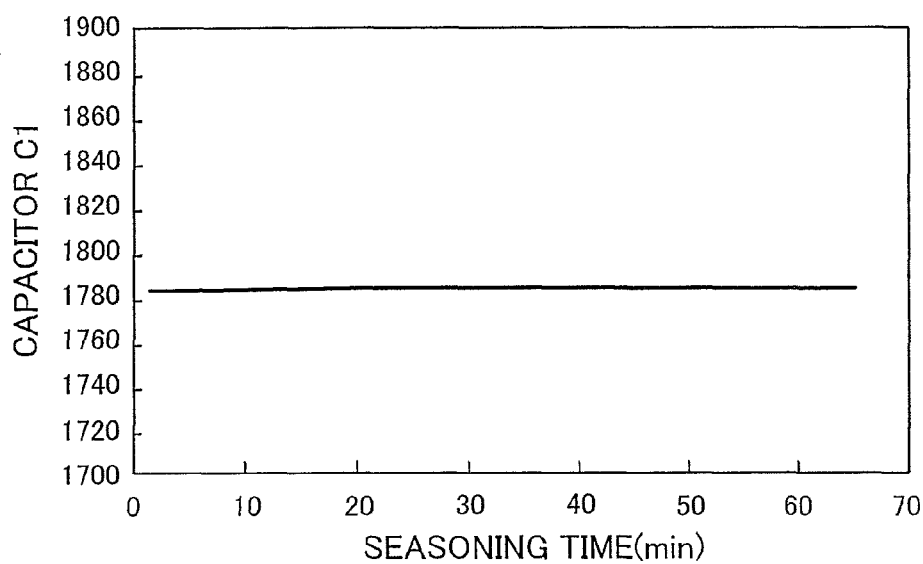
FIG. 8A is a graphic representation of the transition of changes in the matching capacitance of a capacitor as a component in the matching network of FIG. 7 versus the seasoning time.
Figure 8B:
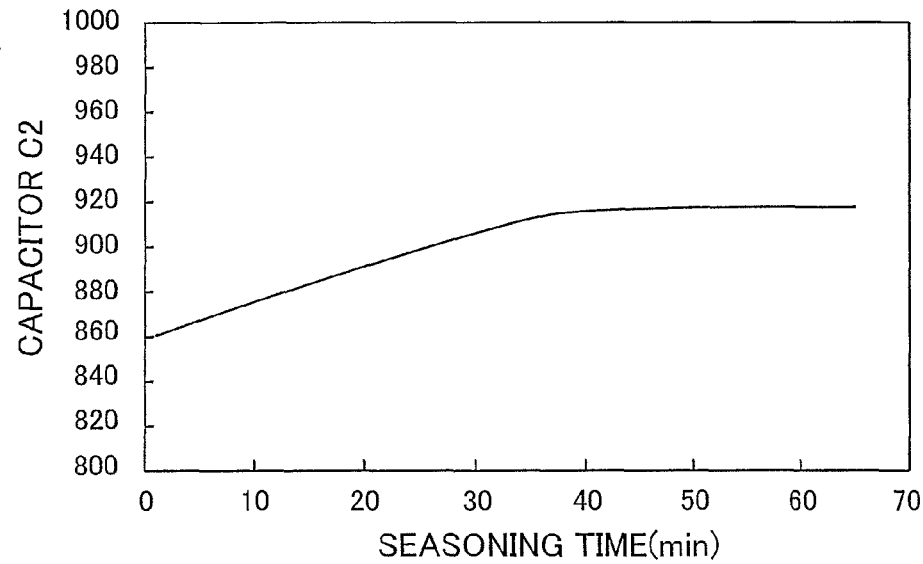
FIG. 8B is a graphic representation of the transition of changes in the matching capacitance of another capacitor as another component in the matching network of FIG. 7 versus the seasoning time.
Figure 8C:
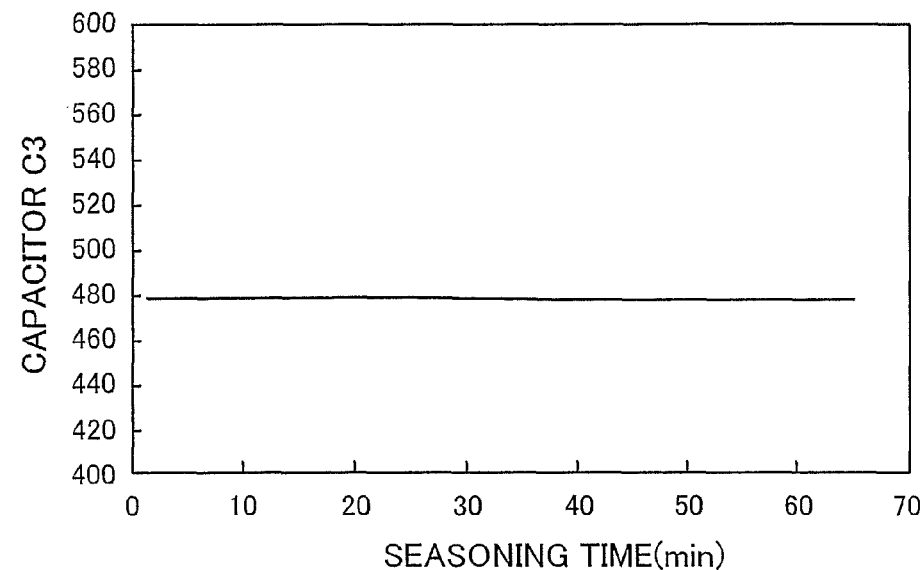
FIG. 8C is a graphic representation of the transition of changes in the matching capacitance of a further capacitor as a further component in the matching network of FIG. 7 versus the seasoning time, all in Example 5.

FIGS. 8A to 8C illustrate the transition of changes in the capacitances (matching capacitances) of the capacitors C1, C2, C3 as components in the matching network 105 upon matching versus the seasoning time after wet cleaning. The halogen-containing gas used in the seasoning was a mixed gas of $Cl_2/O_2/HBr$, the flow rate was 40 mL/min, 5 mL/min and 140 mL/min, the processing pressure was 0.4 Pa, the plasma-producing power was 500 W, and the RF bias applied to the lower electrode was 20 W.

FIG. 8A shows the transition of changes in the matching capacitance of the capacitor C1 as a component in the matching network 105, FIG. 8B illustrates the transition of changes in the matching capacitance of the capacitor C2 as a component in the matching network 105, and FIG. 8C depicts the transition of changes in the matching capacitance of the capacitor C3 as a component in the matching network 105.

Such a tendency may presumably take place as will be described hereinafter. Presumably, when seasoning is insufficient, in other words, shortly after wet cleaning, remaining water and deposits formed through reactions with atmospheric components become out-gas components, so that the atmosphere in the processing chamber becomes unstable and the matching capacitance of each capacitor does not remain steady. When seasoning is sufficient, on the other hand, it is presumed that the atmosphere in the processing chamber becomes stable by deposits formed in the course of the seasoning and the matching capacitance of each capacitor hence remains steady. When the transition of changes in the electrostatic capacitance of each capacitor as a component in the matching network 105 upon matching (matching capacitance) has been monitored and the matching capacitance has increased to a steady value with the seasoning time, the end of the seasoning can be determined accordingly.

Example 6

In this example, the plasma ignition time, which is the time from the application of plasma-producing RF power to the production of a plasma, was chosen as a parameter to be monitored.

After applying wet cleaning to each of two etching apparatus (apparatus 1, apparatus 2) of the same specification, vacuuming was initiated. The internal pressure of each processing chamber was set at 0.0005 Pa or lower. Subsequently, Si wafers (dummy wafers) were transferred in turn into each processing chamber to repeat seasoning. During that seasoning, the plasma ignition time was monitored by the photodetector 113.

As seasoning conditions, the plasma-producing power at 400 W, a mixed gas of $Ar/CF_4/CHF_3/O_2$ was used as a processing gas, and a RF bias to be applied to the lower electrode was set at 150 W.

Figure 9:
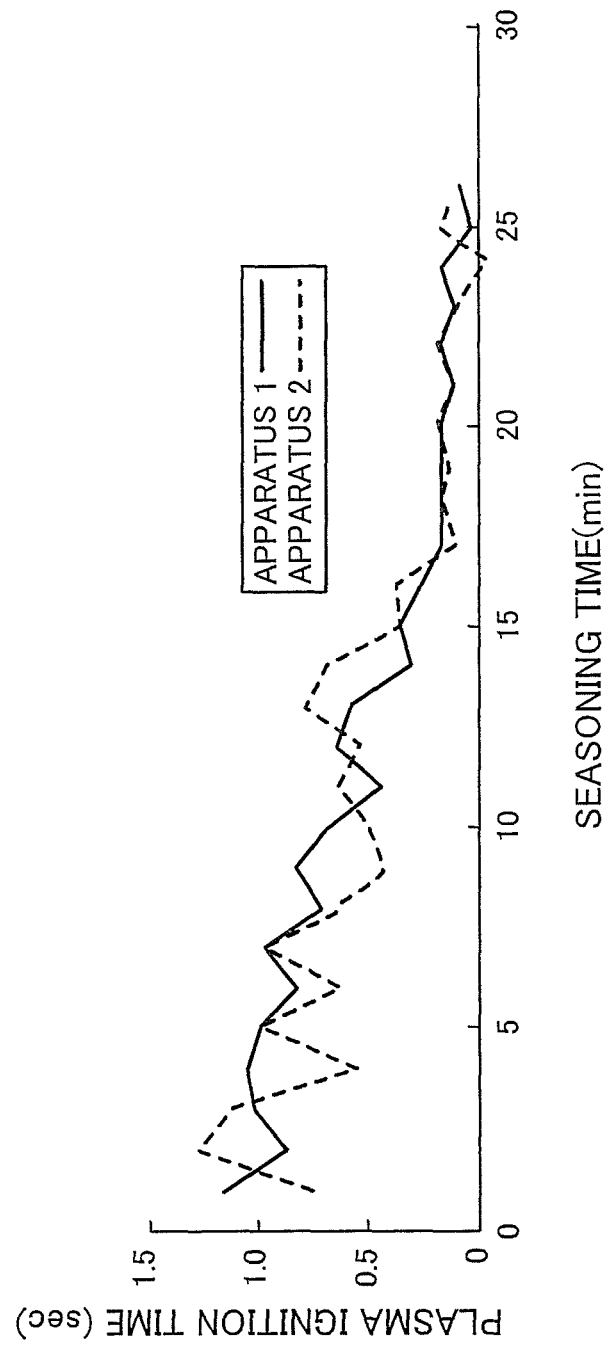
FIG. 9 is a graphic representation of the transition of changes in plasma ignition time in different apparatus versus the seasoning time after wet cleaning in Example 6.

FIG. 9 shows the transition of changes in the plasma ignition time versus the seasoning time after wet cleaning. As shown in FIG. 9, the plasma ignition time was unsteady in both of the apparatus 1 and the apparatus 2. However, the plasma ignition time became steady when the seasoning was repeated. This indicates that water, which still remained on the inner wall of each processing chamber after the wet cleaning, or residues from cleaning were eliminated by the repeated seasoning to stabilize the surface conditions of the inner wall of the processing chamber, and also that reaction products formed as a result of etching action by the seasoning deposited on the inner wall of the processing chamber to stabilize the surface conditions of the inner wall of the processing chamber.

When the transition of changes in the time until the ignition of a plasma from the feeding of plasma-producing RF power to a processing chamber have been monitored and the time has decreased to a steady value with the seasoning time, the end of the seasoning can be determined accordingly.

Example 7

In this example, an electrostatic chuck voltage (ESC voltage) was chosen as a parameter to be monitored. It is to be noted that an electrostatic chuck voltage is a d.c. voltage generated by an electrostatic chuck power source 112 and is a voltage for electrostatically chuck the wafer 108 on the lower electrode 109. The electrostatic chuck voltage varies depending upon the internal resistance of the electrostatic chuck power source 112 even if the source voltage of the power source remains constant. In other words, the electrostatic chuck voltage varies depending upon fluctuations in an electrostatic chuck current.

After applying wet cleaning to each of three etching apparatus (apparatus 1, apparatus 2, apparatus 3) of the same specification, vacuuming was initiated by the turbomolecular pump 116, and the vacuuming was continued until the pressure in its processing chamber reached 0.0005 Pa or lower. A plasma was then produced, for example, by controlling the internal pressure of the processing chamber at 2.0 Pa, setting the plasma-producing power at 600 W and using a mixed gas of $Cl_2/HBr/O_2$ as a processing gas, and under the condition that a RF bias was applied at 50 W, processing was performed.

Figure 10:
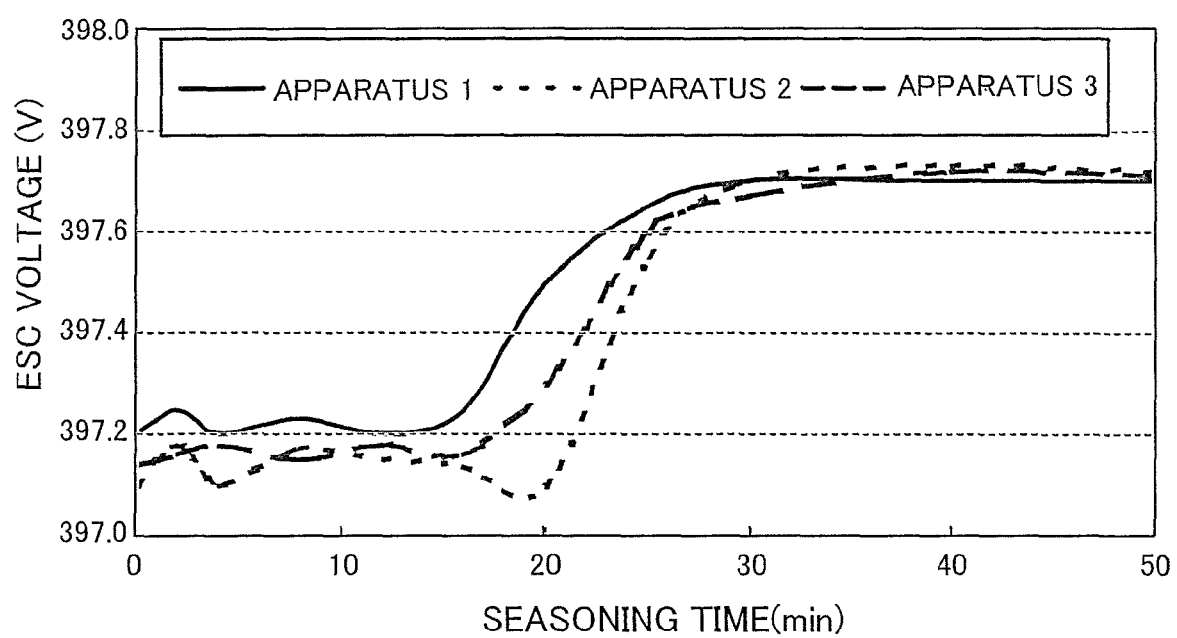
FIG. 10 is a graphic representation of the transition of changes in electrostatic chuck voltage in different apparatus versus the seasoning time in Example 7.

FIG. 10 shows the transition of changes in electrostatic chuck voltage versus the seasoning time. As shown in the graphic diagram, the electrostatic chuck voltage is low shortly after wet cleaning, but becomes steadier as seasoning becomes sufficient. This tendency presumably takes place as will be described hereinafter. When seasoning is insufficient, a discharge becomes unsteady due to out-gas from residual water of wet cleaning or reaction products. Therefore, the electrostatic chuck voltage is low, and its value scatters. When seasoning becomes sufficient, on the other hand, the above-described residual water or reaction products are eliminated so that the out-gas is rendered less to make a plasma steady. As a consequence, the electrostatic chuck voltage becomes steady.

When with a seasoning time, scattering of an electrostatic chuck voltage to be fed to a lower electrode has been progressively reduced and the electrostatic chuck voltage has increased to a steady value, the end of the seasoning can be determined.

Example 8

In this example, the flow rate of heat transfer gas to be fed to between a lower electrode and a wafer placed on the lower electrode was chosen as a parameter to be monitored. The flow rate of the heat transfer gas (He) is high shortly after wet cleaning, but becomes lower and steadier as the seasoning becomes sufficient.

After applying wet cleaning to each of three etching apparatus of the same specification, vacuuming was initiated by the turbomolecular pump 116, and the vacuuming was continued until the pressure in its processing chamber reached 0.0005 Pa or lower. A plasma was then produced, for example, by controlling the internal pressure of the processing chamber at 2.0 Pa, setting the plasma-producing power at 600 W and using a mixed gas of $Cl_2/HBr/O_2$ as a processing gas, and under the condition that a RF bias was applied at 50 W, processing was performed.

By repeating performing seasoning subsequent to the wet cleaning while using Si wafers (dummy wafers), residual water on a head part of the lower electrode was removed, and further, an outer peripheral part of a surface of the lower electrode was covered with reaction products to restore the wafer chuck force. This can be presumed to lower and stabilize the flow rate of the heat transfer gas. It is to be noted that the transition of changes in the pressure of the heat transfer gas (the pressure on the side of the back of the wafer) can also be used in place of the transition of changes in the flow rate of the heat transfer gas.

When the transition of changes in the flow rate of heat transfer gas to be fed to between a lower electrode and a substrate placed on the lower electrode has been monitored and the flow rate has decreased to a steady value with the seasoning time, the end of the seasoning can be determined.

As has been described above, the time points that the end of seasoning was determined in the respective examples, specifically the time points that:

(1) an emission intensity ratio ($C_2/H$) between carbon ($C_2$) and hydrogen (H) in a plasma has decreased to a steady value with plasma processing time, (2) a peak-to-peak voltage of a RF bias to be fed to a lower electrode has risen to a steady value with plasma processing time, (3) an opening of a vacuum valve has decreased to a steady value with plasma processing time, (4) a time required to have an internal pressure of a processing chamber reduced to a predetermined vacuum pressure after completion of each plasma discharge has decreased to a steady value with plasma processing time, (5) a matching electrostatic capacitance of a capacitor, which is a component of a matching network, has increased to a steady value with plasma processing time, (6) a time required until ignition of a plasma from the feeding of RF power to an antenna electrode via the matching network has decreased to a steady value with plasma processing time, (7) with plasma processing time, scattering of an electrostatic chuck voltage to be fed to the lower electrode has decreased and the electrostatic chuck voltage has increased to a steady value, and (8) a flow rate of heat transfer gas to be fed between the lower electrode and a substrate placed on the lower electrode has decreased to a steady value with plasma processing time. can be considered to be closely related to the time point that the supply of out-gas based on water (residual water) or the like adhered upon wet cleaning has stopped or the time point that a predetermined amount of reaction products has deposited on the inner wall of the processing chamber and the conditions of the inner wall of the processing chamber have become steady.

The end of seasoning can, therefore, be determined by indirectly measuring at least an increase in the internal pressure of the processing chamber (an increase in the time required for vacuuming of the processing chamber) as a result of the occurrence of the above-described out-gas. In each of the above-described examples, the end of seasoning was determined by making use of the tendency that during seasoning, the corresponding specific physical value (parameter) changes with the seasoning time and then becomes steady.

Upon setting up criterions which can be relied upon to determine that the above-mentioned physical values have become steady, the present inventors conducted numerous experiments, and recorded how the physical values changed.

Based on the results of the experiments, it has been found that one or more of the parameters each becomes steady at a constant value whenever seasoning is continued subsequent to wet cleaning and that the remaining one or more parameters each becomes steady at a different values upon each wet cleaning.

Where the value of a parameter is not affected by the wearout or like rate or rates of its relevant component or components, for example, the value at which the parameter becomes steady does not change upon each wet cleaning (for example, Examples 2, 3, 4, 5, 6, 7 and 8).

Where the value of a parameter is affected by the wearout or like rate or rates of its relevant component or components, on the other hand, the value at which the parameter becomes steady differs upon each wet cleaning (for example, Example 1).

In the former case (where the value of a parameter is reproduced every time), the end can be determined when the value of the parameter has exceeded (or fallen below) a given threshold. This determination method will hereinafter be called "the level determination method".

In the latter case (where the value of a parameter differs every time), the end cannot be determined if the value of the parameter at a particular time point is solely used. It is, therefore, necessary to determine the end by checking the rates of changes in the parameter in a plurality of seasoning discharges to be performed. Such a determination has been practiced for years in the determination of the end of etching that makes use of a plasma emission. According to this method, a first or second derivative of the parameter is calculated, and a determination is made based on the rate of its change. This method will hereinafter be called "the differential determination method" irrespective of whether the first derivative or the second derivative is relied upon.

Figure 11:
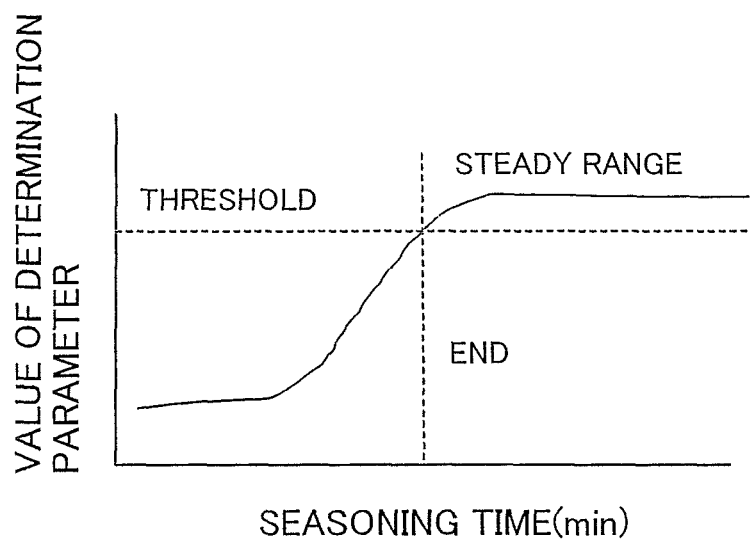
FIG. 11 is a graphic representation of the principle of the level determination method.

FIG. 11 illustrates the principle of the level determination method. As illustrated in FIG. 11, the value of a parameter changes with the seasoning time, and becomes stable in a steady range. When the parameter becomes stable in the steady range upon every wet cleaning as mentioned above and its reproducibility is sufficient, a time point at which the value of the parameter has exceeded, for example, 90% of a steady value in the steady range can be adopted as the end of the seasoning. It is to be noted that in an actual operation, a predetermined dummy discharge time may preferably be added after the determination of the end because the parameter has not fallen within the steady range yet at the end.

Figure 12A:
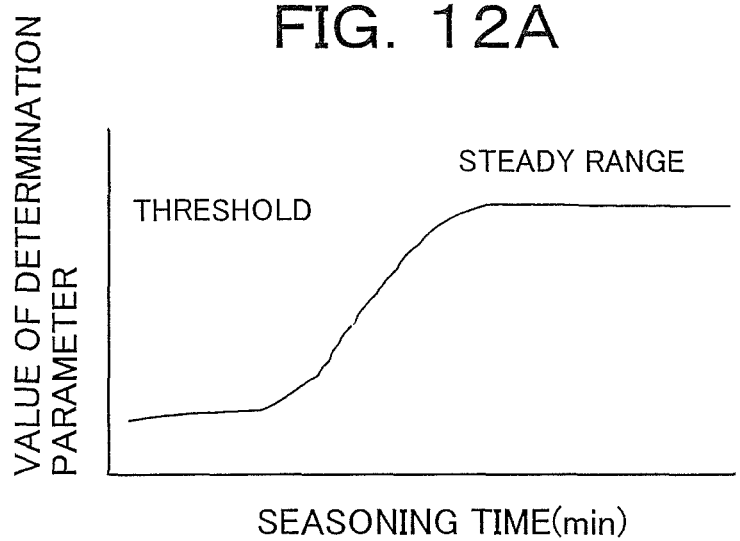
FIGS. 12A, 12B and 12C are graphic representations illustrating the principle of the differential determination method.
Figure 12B:
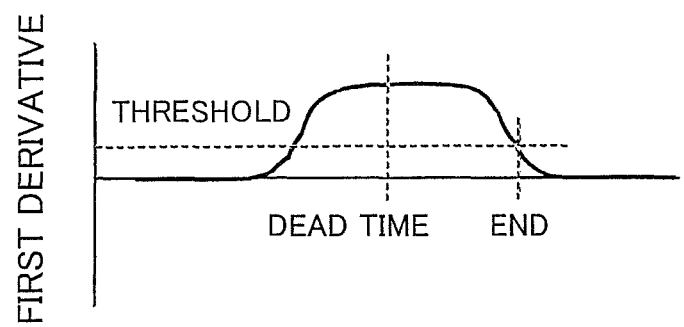
Figure 12C:
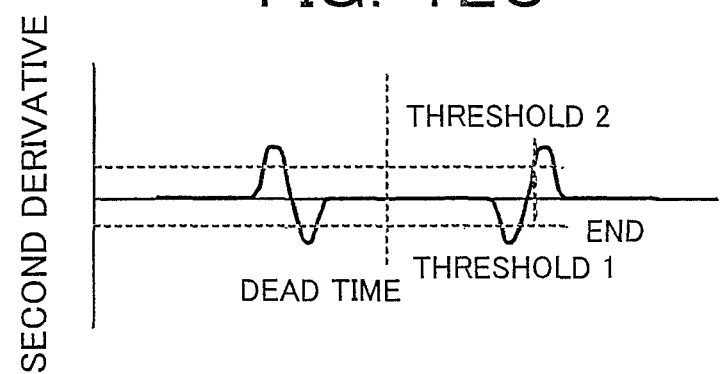

FIGS. 12A, 12B and 12C illustrate the principle of the differential determination method. When a changing parameter is subjected to first differentiation as illustrated in FIG. 12A, a first derivative is obtained as shown in FIG. 12B. When subjected to second differentiation, on the other hand, a second derivative is obtained as shown in FIG. 12C. The thus-obtained first derivative or second derivative is compared with its corresponding threshold to determine the end of the seasoning. Upon determination of the end, a dead time for the prevention of any false determination is set, and a first derivative or second derivative after the lapse of the thus-set dead time is compared with its corresponding threshold to make a determination.

In the case of FIG. 12B, a time point at which the first derivative has fallen below the threshold is determined to be the end, because a first derivative smaller than the threshold indicates a small variation in the parameter.

In the case of FIG. 12C, a time point at which the second derivative has exceeded a threshold of 2 subsequent to its falling below a threshold of 1 is determined to be the end. As the maximal and minimal values of the second derivative indicate inflection points of the original signal, the original signal is found to have changed to rise from a steady state and then to have become steady again by comparing the second derivative with the threshold twice as mentioned above.

Example 9

In this example, the parameters monitored in Examples 1-8 were all monitored as parameters. Described specifically, the parameters monitored in the respective examples can be monitored at the same time during seasoning that makes use of dummy wafers. It is, therefore, possible to determine the end of seasoning by any one of the methods described in Examples 1-8. It is also possible to make a comprehensive determination by using all the parameters. Examples of such a comprehensive determination (Comprehensive Determination Examples 1, 2 and 3) will hereinafter be described with reference to Tables 1, 2 and 3.

TABLE 1

Comprehensive Determination Example 1

| No. | Parameter for determination | Determination of end | Score |
|---|---|---|---|
| 1 | Emission intensity ratio | Determined | 10 |
| 2 | $V_{pp}$ | Determined | 10 |
| 3 | VV opening | Not determined | 0 |
| 4 | Vacuuming time | Not determined | 0 |
| 5 | Electrostatic capacitance upon matching | Not determined | 0 |
| 6 | Plasma ignition time | Determined | 10 |
| 7 | Electrostatic chuck voltage | Determined | 10 |
| 8 | Flow rate of heat transfer gas | Determined | 10 |
| Total | | | 50 |

TABLE 2

Comprehensive Determination Example 2

| No. | Parameter for determination | Determination of end | Weighting factor | Score |
|-----|-----------------------------|----------------------|------------------|-------|
| 1 | Emission intensity ratio | Determined | 2 | 20 |
| 2 | $V_{pp}$ | Determined | 4 | 40 |
| 3 | VV opening | Not determined | 2 | 0 |
| 4 | Vacuuming time | Not determined | 1 | 0 |
| 5 | Electrostatic capacitance upon matching | Not determined | 0.5 | 0 |
| 6 | Plasma ignition time | Determined | 0.5 | 5 |
| 7 | Electrostatic chuck voltage | Determined | 0.5 | 5 |
| 8 | Flow rate of heat transfer gas | Determined | 1 | 10 |
| Total | | | 11.5 | 80 |

TABLE 3

Comprehensive Determination Example 3

| No. | Parameter for determination | Determination of end | Progress (%) | Weighting factor | Score |
|-----|-----------------------------|----------------------|--------------|------------------|-------|
| 1 | Emission intensity ratio | Determined | 100 | 2 | 20 |
| 2 | $V_{pp}$ | Determined | 100 | 4 | 40 |
| 3 | VV opening | Not determined | 20 | 2 | 4 |
| 4 | Vacuuming time | Not determined | 15 | 1 | 1.5 |
| 5 | Electrostatic capacitance upon matching | Not determined | —* | 0.5 | 0 |
| 6 | Plasma ignition time | Determined | 100 | 0.5 | 5 |
| 7 | Electrostatic chuck voltage | Determined | —* | 0.5 | 5 |
| 8 | Flow rate of heat transfer gas | Determined | 100 | 1 | 10 |
| Total | | | | 11.5 | 85.5 |

* The degree of progress was not measurable.

Comprehensive Determination Example 1

Referring to Table 1, scores are firstly allotted to the respective monitored parameters. With respect to each of the monitored parameters, a judgment is next made as to whether the end of seasoning was successfully determined. Only the scores allotted to the parameters each of which allowed to determine the end are cumulatively added.

Described specifically, a score of 10 is allotted to each of the parameters, and the scores allotted to the parameters (Nos. 1, 2, 6, 7 and 8) each of which allowed to determine the end are cumulatively added. As five parameters allowed to determine the end in this example, the cumulative sum is 50. The total score is 80 at the maximum because there are eight parameters to be monitored. When a score of 60 has been achieved out of 80, for example, the seasoning can be determined to be ended at this time point as a comprehensive determination.

Comprehensive Determination Example 2

Referring to Table 2, weighting factors are allotted to the respective parameters to be monitored. As in the example of Table 1, a score of 10 is allotted to each parameter. With respect to each of the monitored parameters, a judgment is next made as to whether the end of seasoning was successfully determined. Only with the scores allotted to the parameters each of which allowed to determine the end, the weighting factors were multiplied, respectively, followed by a cumulative addition.

Described specifically, a score of 10 is allotted to each of the parameters, and further, the weighting factors shown in Table 2 are allotted. With the scores allotted to the parameters (Nos. 1, 2, 6, 7 and 8) each of which allowed to determine the end, the weighting factors were multiplied, followed by a cumulative addition. As five parameters allowed to determine the end in this example, the cumulative sum is 80. The total score is 115 at the maximum because there are eight parameters to be monitored. When a score of 90 has been achieved out of 115, for example, the seasoning can be determined to be ended at this time point as a comprehensive determination. As the total score may become 115 at the maximum in this example, it is preferred to conduct normalization as needed.

Comprehensive Determination Example 3

Reference is made to Table 3. According to the above-described level determination method, it is possible to obtain a value at a part-way progress, which indicates what percentage of a target value the current value amounts to.

In this example, to each of those of monitored parameters that permit measuring their levels, a degree of progress (0 to 100%) is allotted depending upon the measured level.

Firstly, weighting factors are allotted to the respective parameters to be monitored. As in the example of Table 1, a score of 10 is allotted to each parameter. With respect to each of the monitored parameters, a judgment is next made as to whether the end of seasoning was successfully determined. Only with the scores allotted to the parameters each of which allowed to determine the end, the weighting factors and the degrees of progress were multiplied, respectively, followed by a cumulative addition. Specifically, a calculation is made in accordance with the following formula: score=10 (score)×(the degree of progress÷100)×the weighting factor. It is to be noted that the designation of "–" as the degree of progress indicates the use of the differential determination method.

The inclusion of weighting factors and progress degrees as described above makes it possible to perform a finer comprehensive determination, can also avoid an unnecessary seasoning time, and can also save dummy wafers to be used in seasoning.

As has been described above, the present invention has a system for monitoring the transition of changes in an etching parameter with time, and performs a comparison between a monitored value of the etching parameter and a preset criterion value and also a computation to control a system that controls an etching apparatus. It is, therefore, possible to determine with high accuracy the end of seasoning after wet cleaning and then, to end the seasoning. As a consequence, the seasoning time can be limited to the processing of as few dummy wafers as needed at minimum, thereby making it possible to shorten the non-operation time of a semiconductor fabrication apparatus and the fabrication cost of semiconductor devices.

This application claims the priority of Japanese Patent Application 2006-152305 filed May 31, 2006, which is incorporated herein by reference.

The invention claimed is:

1. A plasma processing apparatus comprising:
    a plasma processing chamber having an electrode for placing and retaining plural substrates in turn within said plasma processing chamber;
    a gas feeder for feeding processing gas into said processing chamber;
    a vacuum pump for evacuating gas from said processing chamber via a vacuum valve;

an RF power supply for supplying RF power to said processing chamber via a matching network;

a sensor for monitoring an internal pressure of said processing chamber;

a database unit configured to store criterion values for determining an end of seasoning that is to be performed after wet cleaning;

a computing unit configured to compare data collected by a collection unit with the criterion values stored in the database unit, wherein said computing unit is also configured to determine said end of seasoning when a plurality of conditions, of the following conditions, are satisfied:

(1) a derivative of an emission intensity ratio ($C_2$/H) between carbon ($C_2$) and hydrogen (H) in a plasma has decreased to a steady value that is used to determine said end of seasoning;

(2) a peak-to-peak voltage of a RF bias to be fed to the electrode has risen with plasma processing time to a steady value that is used to determine said end of seasoning;

(3) an opening of said vacuum valve at a time of plasma processing has decreased with plasma processing time to a steady value that is used to determine said end of seasoning;

(4) a time required to have said internal pressure of said processing chamber reduced to a predetermined vacuum pressure after completion of plasma discharge has decreased with plasma processing time to a steady value that is used to determine said end of seasoning;

(5) an electrostatic capacitance at a time of matching by a capacitor, which is a component of said matching network, has increased with plasma processing time to a steady value that is used to determine said end of seasoning; and (6) a time required until ignition of said plasma from feeding of said RF power to said processing chamber via said matching network has decreased with plasma processing time to a steady value that is used to determine said end of seasoning; and a control unit for controlling an etching apparatus based on an output signal from the computing unit.

2. The plasma processing apparatus according to claim 1, wherein the computing unit which is also configured to determine said end of seasoning makes the determination of the end of seasoning based upon a multiplication of a weighting factor of the respective condition and the determination whether the respective condition has been satisfied, to provide a score for each condition, and a cumulative addition of the scores.

* * * * *